(12) United States Patent
Boday et al.

(10) Patent No.: US 9,540,499 B2
(45) Date of Patent: Jan. 10, 2017

(54) ARTICLE OF MANUFACTURE CONTAINING A FLAME RETARDANT FILLER PREPARED FROM A BRIDGED POLYSILSESQUIOXANE

(71) Applicant: International Business Machines Corporation, Armonk, NY (US)

(72) Inventors: Dylan J. Boday, Tucson, AZ (US); Joseph Kuczynski, North Port, FL (US); Robert E. Meyer, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/006,640

(22) Filed: Jan. 26, 2016

(65) Prior Publication Data
US 2016/0137842 A1    May 19, 2016

Related U.S. Application Data

(62) Division of application No. 13/584,017, filed on Aug. 13, 2012, now Pat. No. 9,255,185.

(51) Int. Cl.
| | | |
|---|---|---|
| C08K 5/54 | (2006.01) | |
| C08G 77/30 | (2006.01) | |
| C08G 77/48 | (2006.01) | |
| C08G 77/52 | (2006.01) | |
| B32B 27/38 | (2006.01) | |
| B32B 27/20 | (2006.01) | |
| C08G 77/24 | (2006.01) | |
| H05K 1/03 | (2006.01) | |
| C08G 77/04 | (2006.01) | |
| C08L 83/08 | (2006.01) | |
| C08L 101/00 | (2006.01) | |
| H05K 1/11 | (2006.01) | |
| C08L 63/00 | (2006.01) | |
| C08L 71/12 | (2006.01) | |
| H05K 3/46 | (2006.01) | |
| C08G 77/00 | (2006.01) | |

(52) U.S. Cl.
CPC ............. *C08K 5/5403* (2013.01); *B32B 27/20* (2013.01); *B32B 27/38* (2013.01); *C08G 77/045* (2013.01); *C08G 77/24* (2013.01); *C08G 77/30* (2013.01); *C08G 77/48* (2013.01); *C08G 77/52* (2013.01); *C08L 83/08* (2013.01); *C08L 101/00* (2013.01); *H05K 1/0373* (2013.01); *C08G 77/80* (2013.01); *C08L 63/00* (2013.01); *C08L 71/12* (2013.01); *C08L 2201/02* (2013.01); *C08L 2203/20* (2013.01); *H05K 1/11* (2013.01); *H05K 3/4626* (2013.01); *H05K 2201/012* (2013.01); *Y10T 428/1352* (2015.01)

(58) Field of Classification Search
CPC ..... C08K 5/5415; C08K 5/5419; C08G 77/22; C08G 77/24; C08G 77/30; C08G 77/48; C08G 77/50
USPC ..... 524/261–268; 528/22, 24, 30, 35, 42, 43
See application file for complete search history.

(56) References Cited

U.S. PATENT DOCUMENTS

| | | | |
|---|---|---|---|
| 3,663,587 A | 5/1972 | Holman | |
| 4,031,122 A | 6/1977 | Brown | |
| 4,042,563 A | 8/1977 | Swihart | |
| 4,367,154 A | 1/1983 | Jernigan | |
| 5,371,154 A | 12/1994 | Brandvold et al. | |
| 7,211,192 B2 | 5/2007 | Shea et al | |
| 7,468,225 B2 | 12/2008 | Deguchi et al. | |
| 7,572,515 B2 | 8/2009 | Sethumadhavan et al. | |
| 8,900,491 B2 | 12/2014 | Boday et al. | |
| 9,255,185 B2 | 2/2016 | Boday et al. | |
| 2010/0113659 A1 | 5/2010 | Lim et al. | |
| 2012/0279768 A1 | 11/2012 | Boday et al. | |
| 2013/0196248 A1 | 8/2013 | Kim et al. | |
| 2013/0206463 A1 | 8/2013 | Boday et al. | |
| 2014/0041908 A1 | 2/2014 | Boday et al. | |

FOREIGN PATENT DOCUMENTS

| | | |
|---|---|---|
| WO | 2010019125 A1 | 2/2010 |
| WO | 2012012311 A2 | 1/2012 |

OTHER PUBLICATIONS

Defosse, M., "Plastic additives: Flame retardant demand is—you guessed it—on fire", Plastics Today, 2 pages, Dec. 30, 2010. <http://www.plasticstoday.com/articles/plastic-additives-flame-retardants-demand-is-on-fire>.

Wikipedia contributors, "Sol-gel", Wikipedia, The Free Encyclopedia, 10 pages, Jun. 30, 2012. <http://en.wikipedia.org/w/index.php?title=Sol-gel&oldid=500059213>.

(Continued)

*Primary Examiner* — Marc Zimmer
(74) *Attorney, Agent, or Firm* — Matthew J. Bussan

(57) ABSTRACT

A bridged polysilsesquioxane-based flame retardant filler imparts flame retardancy to manufactured articles such as connectors and other articles of manufacture that employ thermosetting plastics or thermoplastics. In an exemplary synthetic method, a bridged polysilsesquioxane-based flame retardant filler is prepared by sol-gel polymerization of a monomer having two or more trialkoxysilyl groups attached to an organic bridging group that contains a fire retardant group (e.g., a halogen atom, a phosphinate, a phosphonate, a phosphate ester, and combinations thereof). Bridged polysilsesquioxane particles formed by sol-gel polymerization of (((2,5-dibromo-1,4-phenylene)bis(oxy))bis(ethane-2,1-diyl))bis(trimethoxysilane), for example, and follow-on sol-gel processing may serve both as a filler for rheology control (viscosity, flow, etc.) and a flame retardant.

13 Claims, 3 Drawing Sheets

(56) References Cited

OTHER PUBLICATIONS

"Bridged Polysilsesquioxanes", Sandia National Laboratories, 2 pages, accessed May 30, 2012. <http://www.sandia.gov/inorganic-organic-materials-group/bridged1.htm>.

Jurado-Gonzalez et al., "A new solid catalyst: the first phosphonate and phosphonic acid functionalised microporous polysilsesquioxanes", Chemical Communications, 2001, pp. 67-68.

"Overview of Flame Retardants", said to have been previously published in Chimica Oggi/Chemistry Today, vol. 16, 1998, 19 pages.

Lu et al., "Applications of Sol-Gel-Processed Interphase Catalysts", Chemical Reviews, 2002, vol. 102, No. 10, pp. 3543-3578.

Lindner et al., "Sol-Gel Processed Phosphine Ligands with Two T- or D-Silyl Functionalities and Their (n5-05Me5)Ru (II) Complexes", Chemistry of Materials, vol. 11, 1999, pp. 1833-1845.

U.S. Appl. No. 13/584,017, to Boday et al., entitled "Flame Retardant Fillers Prepared From Bridged Polysilsesquioxanes", filed Aug. 13, 2012, assigned to International Business Machines Corporation.

U.S. Appl. No. 15/006,261, to Boday et al., entitled "Electronic Circuit Board Containing a Flame Retardant Filler Prepared From a Bridged Polysilsesquioxane", filed Jan. 26, 2016, assigned to International Business Machines Corporation.

U.S. Appl. No. 15/006,303, to Boday et al., entitled "Flame Retardant Fillers Prepared From Bridged Polysilsesquioxanes", filed Jan. 26, 2016, assigned to International Business Machines Corporation.

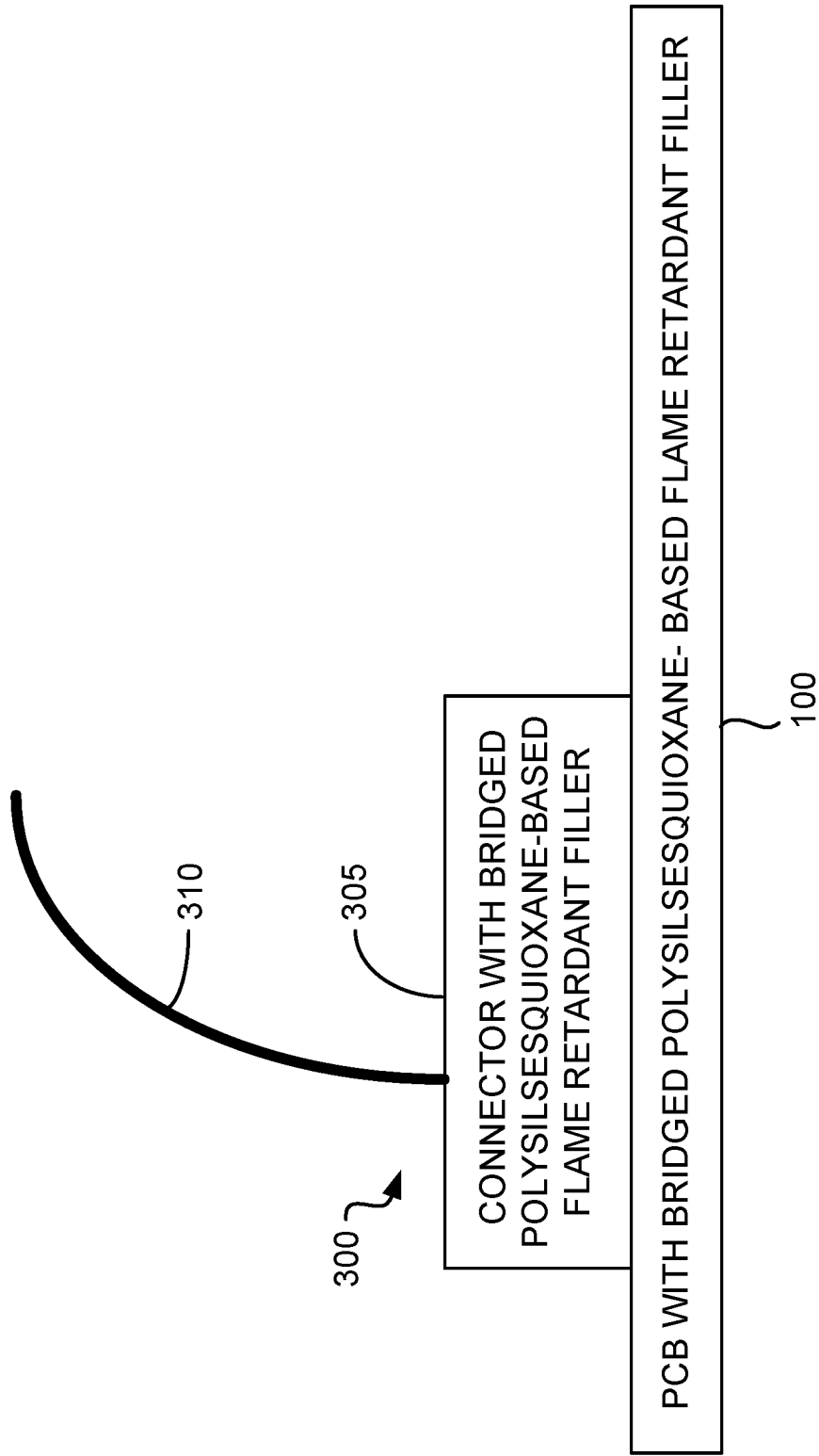

ARTICLE OF MANUFACTURE CONTAINING A FLAME RETARDANT FILLER PREPARED FROM A BRIDGED POLYSILSESQUIOXANE

CROSS-REFERENCE TO RELATED APPLICATION

This patent application is a divisional application of pending U.S. patent application Ser. No. 13/584,017, filed Aug. 13, 2012, entitled "FLAME RETARDANT FILLERS PREPARED FROM BRIDGED POLYSILSESQUIOXANES", which is hereby incorporated herein by reference in its entirety.

BACKGROUND OF THE INVENTION

1. Field of Invention

The present invention relates in general to the field of flame retardancy. More particularly, the present invention relates to using flame retardant fillers prepared from bridged polysilsesquioxanes to impart flame retardancy to manufactured articles such as connectors and other articles of manufacture that employ thermosetting plastics or thermoplastics.

2. Background Art

In the manufacture of PCBs, connectors, and other articles of manufacture that employ thermosetting plastics (also known as "thermosets") or thermoplastics, incorporation of a filler material as well as a flame retardant is required for rheology control (viscosity, flow, etc.) and ignition resistance, respectively. Typically, both attributes are not found in one material. That is, silica particles are generally the filler of choice for rheology control, whereas brominated organic compounds impart flame retardancy. Consequently, the base material (e.g., epoxy resin for PCBs, and liquid crystal polymer (LCP) for connectors) properties are compromised because a relatively large quantity of both a filler and a flame retardant is necessary to achieve the desired properties.

Therefore, a need exists for an improved mechanism for imparting flame retardancy to manufactured articles such as PCBs, connectors, and other articles of manufacture that employ thermoplastics or thermosets.

SUMMARY OF THE INVENTION

In accordance with some embodiments of the present invention, a bridged polysilsesquioxane-based flame retardant filler imparts flame retardancy to manufactured articles such as connectors and other articles of manufacture that employ thermosetting plastics or thermoplastics. In an exemplary synthetic method, a bridged polysilsesquioxane-based flame retardant filler is prepared by sol-gel polymerization of a monomer having two or more trialkoxysilyl groups attached to an organic bridging group that contains a fire retardant group (e.g., a halogen atom, a phosphinate, a phosphonate, a phosphate ester, and combinations thereof). Bridged polysilsesquioxane particles formed by sol-gel polymerization of (((2,5-dibromo-1,4-phenylene)bis(oxy))-bis(ethane-2,1-diyl))bis(trimethoxysilane), for example, and follow-on sol-gel processing may serve both as a filler for rheology control (viscosity, flow, etc.) and a flame retardant.

BRIEF DESCRIPTION OF THE DRAWINGS

The preferred exemplary embodiments of the present invention will hereinafter be described in conjunction with the appended drawings, where like designations denote like elements.

FIG. 3 is a block diagram illustrating an exemplary connector having a plastic housing that incorporates a bridged polysilsesquioxane-based flame retardant filler in accordance with some embodiments of the present invention.

DETAILED DESCRIPTION OF THE PREFERRED EMBODIMENTS

Figure 1:
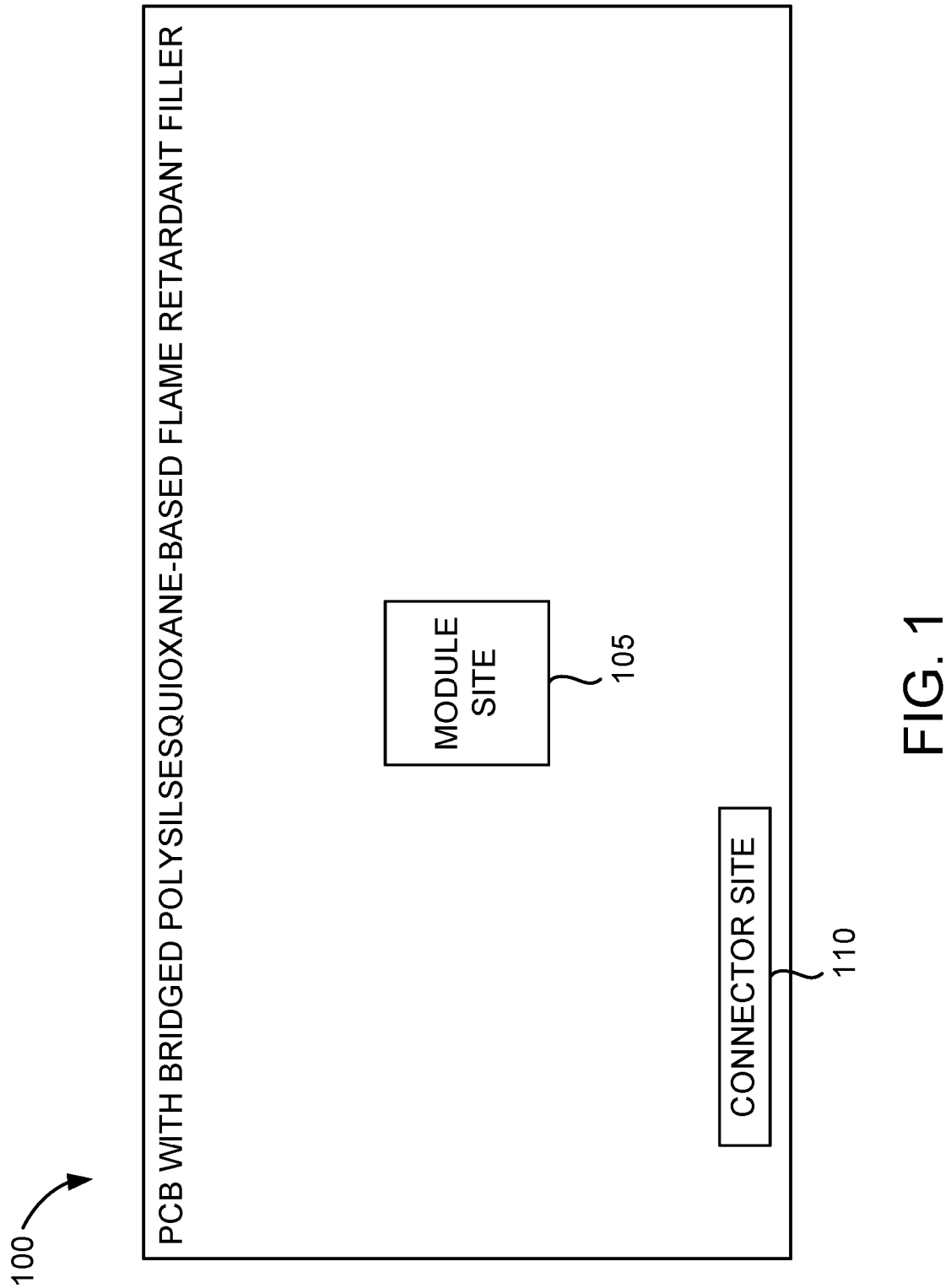
FIG. 1 is a block diagram illustrating an exemplary printed circuit board (PCB) having layers of dielectric material that incorporate a bridged polysilsesquioxane-based flame retardant filler in accordance with some embodiments of the present invention.

In accordance with some embodiments of the present invention, a bridged polysilsesquioxane-based flame retardant filler imparts flame retardancy to manufactured articles such as printed circuit boards (PCBs), connectors, and other articles of manufacture that employ thermosetting plastics or thermoplastics. In an exemplary synthetic method, a bridged polysilsesquioxane-based flame retardant filler is prepared by sol-gel polymerization of a monomer having two or more trialkoxysilyl groups attached to an organic bridging group that contains a fire retardant group (e.g., a halogen atom, a phosphinate, a phosphonate, a phosphate ester, and combinations thereof). Bridged polysilsesquioxane particles formed by sol-gel polymerization of (((2,5-dibromo-1,4-phenylene)bis(oxy))-bis(ethane-2,1-diyl))bis(trimethoxysilane), for example, and follow-on sol-gel processing may serve both as a filler for rheology control (viscosity, flow, etc.) and a flame retardant.

An exemplary printed circuit board (PCB) implementation of the present invention is described below with reference to FIGS. 1 and 2, while an exemplary connector implementation of the present invention is described below with reference to FIG. 3. However, those skilled in the art will appreciate that the present invention applies equally to any manufactured article that employs thermosetting plastics (also known as "thermosets") or thermoplastics.

As described below, a bridged polysilsesquioxane in accordance with some embodiments of the present invention may be synthesized by, for example, preparing a halogen-containing silane monomer having two or more trialkoxysilyl groups attached to an organic bridging group that contains a halogen-based fire retardant group such as one or more bromine atoms, and then reacting the halogen-containing silane monomer via sol-gel polymerization. This first pathway to prepare a bridged polysilsesquioxane in accordance with some embodiments of the present invention is exemplified by reaction schemes 1 and 2, below.

However, those skilled in the art will appreciate that a bridged polysilsesquioxane in accordance with some embodiments of present invention may be synthesized using other processes and reaction schemes. For example, a bridged polysilsesquioxane in accordance with some embodiments of the present invention may be synthesized by, for example, preparing a phosphorous-containing silane monomer having two or more trialkoxysilyl groups attached to an organic bridging group that contains a phosphorous-based flame retardant group such as a phosphinate, and then reacting the phosphorous-containing silane monomer via sol-gel polymerization. This second pathway to prepare a bridged polysilsesquioxane in accordance with some embodiments of the present invention is exemplified by reaction scheme 3, below.

Once the sol-gel polymerization reaction of either the first or second pathway is complete, conventional follow-on sol-gel processing may be used to produce bridged polysilsesquioxane particles in accordance with some embodiments of the present invention. These particles may serve both as a filler for rheology control (viscosity, flow, etc.) and a flame retardant. Typically, the organic-based solvent used in the sol-gel polymerization reaction is removed after the sol-gel polymerization reaction is complete. The gel is then dried, and crushed into particles. In terms of size, the bridged polysilsesquioxane particles may be course particles, fine particles, ultrafine particles, or nanoparticles.

The first pathway entails synthesizing brominated silane precursors that can be polymerized, via sol-gel chemistry, to form bridged polysilsesquioxanes. The polysilsesquioxanes are modified with a very high level of bromine and function as both rheology modifiers and flame retardants.

The first pathway is exemplified below in two non-limiting reaction schemes (i.e., reaction schemes 1 and 2). A reaction scheme (reaction scheme 1) follows for synthesizing a bridged polysilsesquioxane (third step of reaction scheme 1) through an intermediate synthesis of a vinyl-functionalized substituted monomer by reacting 2,5-dibromohydroquinone and allyl chloride (first step of reaction scheme 1) and then, in turn, an intermediate synthesis of a substituted silane monomer by reacting the vinyl-functionalized substituted monomer and trimethoxysilane (second step of reaction scheme 1) in accordance with some embodiments of the present invention. Hence, reaction scheme 1 has three steps. In the first step of the first reaction scheme, 2,5-dibromohydroquinone is reacted with allyl chloride in the presence of triethylamine to form 1,4-bis(allyloxy)-2,5-dibromobenzene. This compound is subsequently reacted with trimethoxysilane in the second step of the first reaction scheme in the presence of a Pt catalyst to form the substituted silane monomer, (((2,5-dibromo-1,4-phenylene)bis(oxy))bis(ethane-2,1-diyl))bis(trimethoxysilane). This substituted silane monomer then undergoes sol-gel polymerization in the third step of the first reaction scheme and subsequently undergoes conventional sol-gel processing to form bridged polysilsesquioxane particles.

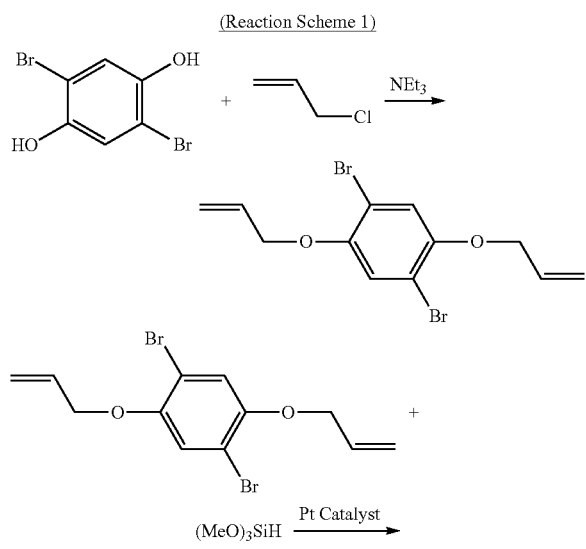

(Reaction Scheme 1)

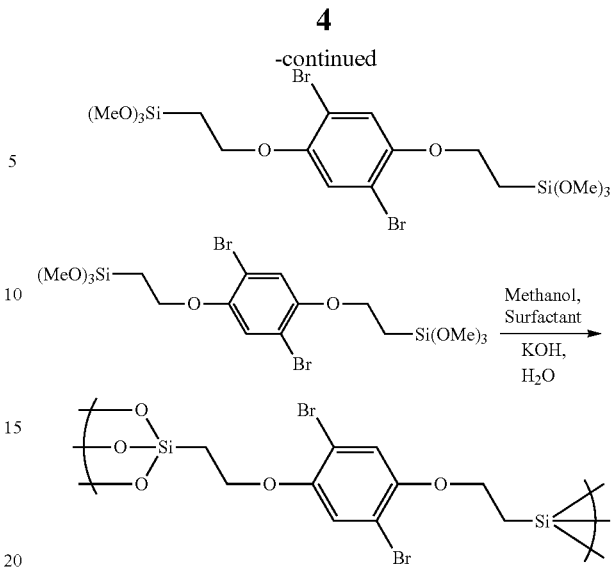

The first step of reaction scheme 1 is performed at room temperature using conventional procedures well known to those skilled in the art. In this first step, 2,5-dibromohydroquinone is reacted with allyl chloride in the presence of triethylamine to form 1,4-bis(allyloxy)-2,5-dibromobenzene. Generally, stoichiometric quantities of the reactants may be used. Triethylamine is the solvent.

The second step of reaction scheme 1 is performed at room temperature using conventional procedures well known in the art. In this second step, 1,4-bis(allyloxy)-2,5-dibromobenzene is reacted with trimethoxysilane in the presence of a Pt catalyst to form the substituted silane monomer, (((2,5-dibromo-1,4-phenylene)bis(oxy))bis(ethane-2,1-diyl))bis(trimethoxysilane). Generally, stoichiometric quantities of the reactants may be used. The reaction is performed in the presence of a hydrosilylation catalyst such as Karstedt's catalyst (Platinum(0)-1,3-divinyl-1,1,3,3-tetramethyldisiloxane complex solution) or other catalyst known to those skilled in the art within a suitable solvent such as toluene or other solvent known to those skilled in the art to dissolve the hydrosilylation catalyst. The hydrosilylation catalyst used is typically a Pt catalyst. The preferred Pt catalyst is Karstedt's catalyst. However, one skilled in the art will appreciate that any of a number of other catalysts may be used. For example, [Cp*Ru(MeCN)$_3$]PF$_6$ (available from Sigma-Aldrich, St. Louis, Mo.) is a hydrosilylation catalyst that may be utilized in the second step of reaction scheme 1. Using [Cp*Ru(MeCN)$_3$]PF$_6$ catalyst, 2-5 mol % catalyst is typically used in acetone at room temperature.

Trimethoxysilane is a commercially available, conventional hydrogen-terminated silane coupling agent. Typically, a coupling agent is used to join two disparate surfaces. In the manufacture of printed circuit boards (PCBs), a silane coupling agent is often used to join a varnish coating (e.g., an epoxy-based resin) to a substrate (e.g., glass cloth) to define a laminate, or laminated structure. The silane coupling agent typically consists of an organofunctional group to bind to the varnish coating and a hydrolyzable group that binds to the surface of the substrate. In particular, the alkoxy groups on the silicon hydrolyze to silanols, either through the addition of water or from residual water on the surface of the substrate. Subsequently, the silanols react with hydroxyl groups on the surface of the substrate to form a siloxane bond (Si—O—Si) and eliminate water.

The third step of reaction scheme 1 is performed at room temperature using conventional procedures well known in the art. In this third step, the substituted silane monomer, (((2,5-dibromo-1,4-phenylene)bis(oxy))bis(ethane-2,1-diyl))bis(trimethoxysilane), undergoes sol-gel polymerization to form a bridged polysilsesquioxane. The substituted silane monomer may be purified by fractional distillation prior to sol-gel polymerization. Generally, purification is preferred but not necessary.

Sol-gel polymerization techniques are well known in the art. For example, U.S. Pat. No. 5,371,154, issued Dec. 6, 1994 to Brandvold et al., entitled "PROCESS FOR FORMING ACID FUNCTIONALIZED ORGANICALLY-BRIDGED POLYSILSESQUIOXANES", discloses sol-gel processing techniques in the context of a process for forming a solid acid catalyst. The process disclosed in the Brandvold et al. patent involves polymerizing a monomer through sol-gel processing to form an organically-bridged polysilsesquioxane, reacting an acid group onto the organic portion of the organically bridged polysilsesquioxane, and recovering the acid functionalized product. The Brandvold et al. patent is hereby incorporated herein by reference in its entirety.

Generally, sol-gel polymerization techniques are characterized by: 1) hydrolysis of monomers to silanols; and 2) condensation of the silanols to form siloxanes, first as a colloidal solution (sol), and thereafter with continued condensation accompanied by extensive branching and cross-linking, to form an integrated network (gel), i.e., a solid, amorphous, three-dimensional network of siloxane linkages having organically bridged silicon atoms (i.e., bridged polysilsesquioxanes), where the network is supported by a solvent. Hence, sol-gel polymerization is a wet-chemical technique in which a sol gradually evolves to form a gel-like diphasic system containing both a liquid phase and a solid phase.

Generally, water is the solvent of choice in sol-gel polymerization techniques. The choice of solvent is not critical as long as the monomer is soluble in the solvent, and the solvent is at least partially miscible with water. Acceptable solvents include, but are not limited to, alcohols, ethers and polar aprotic solvents. The following solvents are the most common: ethanol, methanol, isopropyl alcohol, tetrahydrofuran, dimethylformamide, and acetonitrile. Furthermore, various other hydrocarbon solvents in which the monomer is miscible may be used as cosolvents. One example of such a cosolvent is benzene. Which solvent is preferred depends on the solubility of the subject monomer. In many cases, the preferred solvents are tetrahydrofuran, methanol, ethanol, and mixtures thereof. In the third step of reaction scheme 1, the exemplary solvent is methanol.

In addition, one or more surfactants may be used in the sol-gel polymerization. Typically, a surfactant is added to the solvent in order to moderate the sol/gel transition, i.e., formation of the gel network. Suitable surfactants include, but are not limited to, sodium dodecyl sulfate (SDS) and cetyltrimethylammonium bromide (CTAB). The surfactants would be used at concentrations below their critical micelle concentration (CMC), i.e., 0.0082 M for SDS and 0.001 M for CTAB, both at 25° C. In the third step of reaction scheme 1, the exemplary surfactant may be SDS.

Initially, the substituted silane monomer, (((2,5-dibromo-1,4-phenylene)bis(oxy))bis(ethane-2,1-diyl))bis(trimethoxysilane), is solubilized in a suitable solvent. As noted above, the solvent may also contain a suitable surfactant. Then, the solution is treated with at least a three molar equivalent of water in the presence of an acid or base to catalyze the sol-gel polymerization reaction. The methoxysilanes of the monomer are hydrolyzed to silanols which then condense with either other silanols or methoxysilanes to generate siloxane bonds. The hydrolysis and condensation reactions may require from less than 1 to 48 hours at room temperature. The choice of base is not critical to the success of the sol-gel polymerization, and the most common base is aqueous ammonia at concentrations as low as 5.0 mol % to as high as 570 mol %. Similarly, when acid is employed, the choice of acid is not critical to the success of the sol-gel polymerization reaction and typically mineral acid is used, the most frequent being aqueous hydrochloric acid at a concentrations as low as 0.5 mol % or as high as 10.8 mol %. In the third step of reaction scheme 1, the exemplary base is potassium hydroxide.

The bridged polysilsesquioxane synthesized in the third step of reaction scheme 1 subsequently undergoes conventional sol-gel processing to form bridged polysilsesquioxane particles. Typically, the organic-based solvent used in the sol-gel polymerization reaction is removed after the sol-gel polymerization reaction is complete. The gel is then dried, and crushed into particles. In terms of size, the bridged polysilsesquioxane particles may be course particles, fine particles, ultrafine particles, or nanoparticles.

After the hydrolysis and condensation reactions are complete (i.e., the sol-gel polymerization is complete), and the gel has formed and cured for at least forty-eight hours, the solvent typically must be removed. Solvent may be removed by supercritical drying, solvent extraction, or simply breaking up the gel and washing with water. Supercritical drying is accomplished by placing the wet gel in an autoclave to dry using $CO_2$ at supercritical conditions of 50° C. and 2000 psig for 6 to 24 hours. When the drying is accomplished under these supercritical conditions, there is no liquid vapor interface to develop strain and the dried gel shows little fracturing.

Solvent extraction is a multistep procedure which requires the successive treatment of the wet gel with solvents of decreasing dielectric constant. For example, if tetrahydrofuran was used in the processing, the tetrahydrofuran could be replaced directly with ether. On the other hand, if methanol was used in the processing (e.g., the third step of reaction scheme 1), the methanol must be first exchanged with tetrahydrofuran, and then the tetrahydrofuran is replaced with ether. To perform the solvent exchange, the gel is placed in a fine fritted glass funnel containing twice the gel volume of the solvent used in the sol-gel polymerization reaction. Then the gel is washed with the next solvent in the same manner, continuing until the last solvent passed over the gel is ether.

Also the wet gel can simply be broken up and washed with water to remove the solvent. This procedure typically is utilized only when the degree of fracturing in the gel is not a concern.

After the solvent is removed, the gel is then dried under vacuum for twenty-four hours at room temperature. The gel may now be crushed into particles, and re-dried under vacuum. The resultant particles may be course particles, fine particles, ultrafine particles, or nanoparticles.

Those skilled in the art will appreciate that the various steps of reaction scheme 1 are set forth for the purpose of illustration not limitation. For example, the first step of reaction scheme 1 synthesizes a particular vinyl-functionalized substituted monomer, 1,4-bis(allyloxy)-2,5-dibromobenzene, by reacting 2,5-dibromohydroquinone and allyl chloride in the presence of triethylamine. This particular synthesis of this particular vinyl-functionalized substituted monomer is exemplary. Any suitable vinyl-functionalized substituted monomers may be synthesized in lieu of 1,4-bis (allyloxy)-2,5-dibromobenzene. The vinyl-functionalized TBBPA-based monomer synthesized in the first step of reaction scheme 2 is an example of another suitable vinyl-substituted monomer. In general, suitable vinyl-functionalized substituted monomers in accordance with some embodiments of the first pathway include any organic monomer that is vinyl-functionalized in at least two sites (e.g., hydroquinone-based monomers, bisphenol A-based monomers) and substituted with one or more halogen atoms.

The second step of reaction scheme 1 synthesizes a particular substituted silane monomer, (((2,5-dibromo-1,4-phenylene)bis(oxy))bis(ethane-2,1-diyl))bis(trimethoxysilane), by reacting 1,4-bis(allyloxy)-2,5-dibromobenzene with trimethoxysilane in the presence of a Pt catalyst. This particular synthesis of this particular substituted silane monomer is exemplary. Any suitable substituted silane monomer may be synthesized in lieu of (((2,5-dibromo-1, 4-phenylene)bis(oxy))bis(ethane-2,1-diyl))bis(trimethoxysilane). The substituted silane monomer synthesized in the second step of reaction scheme 2 is an example of another suitable substituted silane monomer. In general, suitable substituted silane monomers in accordance with some embodiments of the first pathway include two or more trialkoxysilyl groups attached to an organic bridging group that contains a halogen based flame retardant. Typically, the organic bridging group has a backbone portion that includes at least two oxygen atoms. Those skilled in the art will appreciate that such a monomer may be synthesized by reacting any suitably functionalized substituted monomer (e.g., a halogen based flame retardant functionalized to contain a suitable functional group) with any suitable silane coupling agent. In general, suitable functional groups may include vinyl, isocyanate, amine, and epoxy functional groups. In general, suitable silane coupling agents include conventional hydrogen-terminated silanes, such as trimethoxysilane and triethoxysilane, and conventional vinyl-terminated silanes, such as vinyltrimethoxysilane and vinyltriethoxysilane.

A hydrogen-terminated silane, such as trimethoxysilane, may be used in the second step of reaction scheme 1 to synthesize the substituted silane monomer by hydrosilylation catalyzed coupling. As noted above, trimethoxysilane is a commercially available, conventional hydrogen-terminated silane coupling agent. The substituted silane monomer is synthesized in the second step of reaction scheme 1 by hydrosilylation catalyzed coupling of the hydrogen-terminated silane onto the vinyl-functionalized substituted monomer (which is synthesized in the first step of reaction scheme 1). Alternatively, a vinyl-terminated silane, such as vinyltrimethoxysilane, may be used in the second step of reaction scheme 1 to synthesize the substituted silane monomer by olefin metathesis catalyzed coupling. In this alternative case, the substituted silane monomer is synthesized by olefin metathesis catalyzed coupling of the vinyl-terminated silane onto the vinyl-functionalized substituted monomer (which is synthesized in the first step of reaction scheme 1). This reaction is performed in the presence of an olefin metathesis catalyst such as Grubbs' catalyst (first generation (G1) and/or second generation (G2)), Schrock akylidenes, or other catalysts known to those skilled in the art within a suitable solvent such as dichloromethane (DCM) or other solvent known to those skilled in the art to dissolve the olefin catalyst. Generally, stoichiometric quantities of reactants may be used. This reaction is performed at room temperature using conventional procedures well known in the art.

A reaction scheme (reaction scheme 2) follows for synthesizing a bridged polysilsesquioxane (third step of reaction scheme 2) through an intermediate synthesis of a vinyl-functionalized substituted monomer by reacting TBBPA and allyl bromide (first step of reaction scheme 2) and then, in turn, an intermediate synthesis of a substituted silane monomer by reacting the vinyl-functionalized substituted monomer and trimethoxysilane (second step of reaction scheme 2) in accordance with some embodiments of the present invention. Hence, reaction scheme 2 has three steps. In the first step of the second reaction scheme, tetrabromobisphenol A (TBBPA) is reacted with allyl bromide in the presence of sodium hydroxide (NaOH) and tetrahydrofuran (THF) to form the vinyl-functionalized substituted monomer. This compound is subsequently reacted in the second step of the second reaction scheme in the presence of a Pt catalyst to form the substituted silane monomer. This substituted silane monomer then undergoes sol-gel polymerization in the third step of the second reaction scheme and in subsequent sol-gel processing to form bridged polysilsesquioxane particles.

(Reaction Scheme 2)

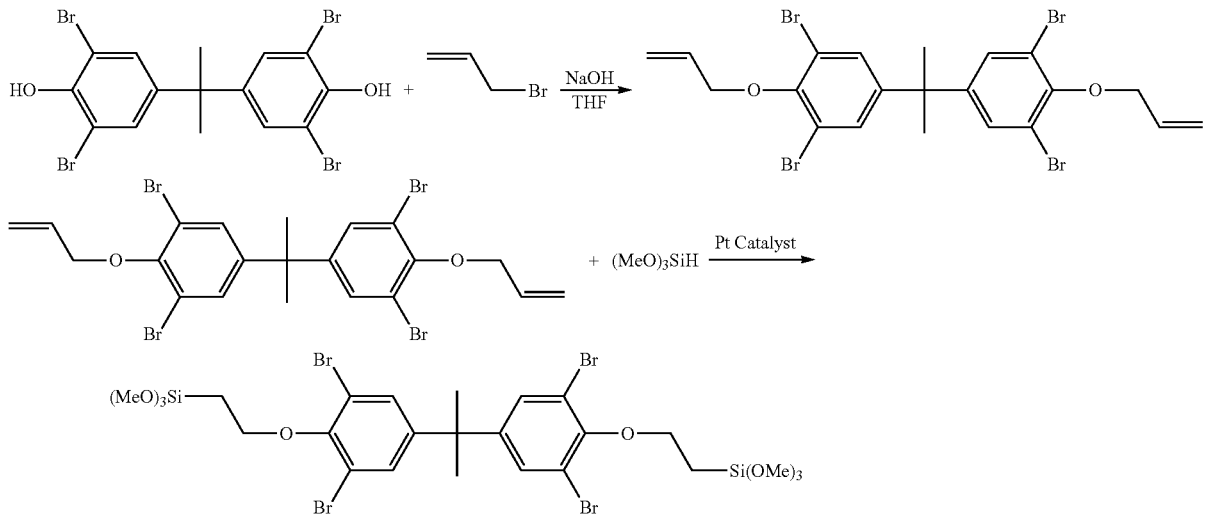

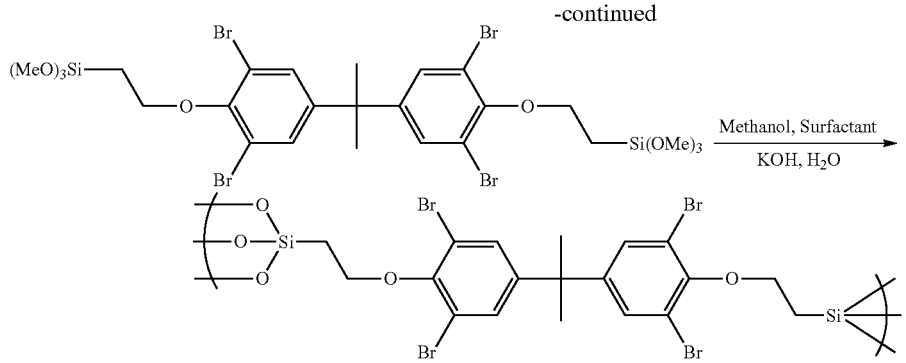

The first step of reaction scheme 2 is performed at room temperature using conventional procedures well known to those skilled in the art. In this first step, tetrabromobisphenol A (TBBPA) is reacted with allyl bromide in the presence of sodium hydroxide (NaOH) and tetrahydrofuran (THF) to form the vinyl-functionalized substituted monomer. Generally, stoichiometric quantities of the reactants may be used. THF is the solvent. Potassium hydroxide (KOH) may be used in lieu of NaOH. Both are typically used in the 1M concentration range, but more specifically, the reaction requires six equivalents of alkaline water for each bridged silsesquioxane molecule.

The second and third steps of reaction scheme 2 respectively correspond to the second and third steps of reaction scheme 1, described above.

The bridged polysilsesquioxane synthesized in the third step of reaction scheme 2 subsequently undergoes conventional sol-gel processing to form bridged polysilsesquioxane particles. Suitable conventional sol-gel processing is described above with respect to reaction scheme 1.

The second pathway is exemplified below in another non-limiting reaction scheme (i.e., reaction scheme 3). A reaction scheme (reaction scheme 3) follows for synthesizing a bridged polysilsesquioxane (second step of reaction scheme 3) through an intermediate synthesis of a phosphorous-containing silane monomer by reacting a vinyl-functionalized phosphorous-containing monomer and trimethoxysilane (first step of reaction scheme 3) in accordance with some embodiments of the present invention. Hence, reaction scheme 3 has two steps. In the first step of the third reaction scheme, ethyl divinyl phosphinate is reacted with trimethoxysilane in the presence of a Pt catalyst to form a phosphorous-containing silane monomer. This phosphorous-containing silane monomer then undergoes sol-gel polymerization in the second step of the third reaction scheme and subsequently undergoes conventional sol-gel processing to form bridged polysilsesquioxane particles.

(Reaction Scheme 3)

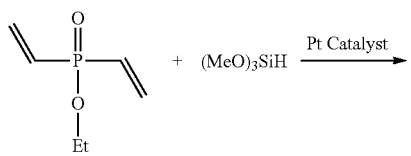

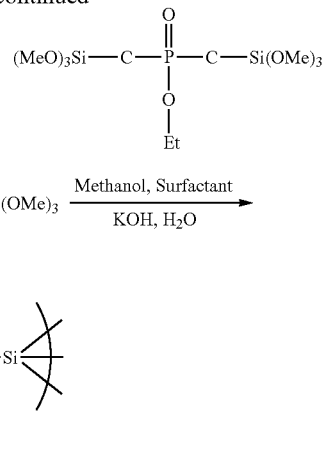

The first step of reaction scheme 3 is performed at room temperature using conventional procedures well known in the art. In this first step, ethyl divinyl phosphinate is reacted with trimethoxysilane in the presence of a Pt catalyst to form the phosphorous-containing silane monomer. Generally, stoichiometric quantities of the reactants may be used. The reaction is performed in the presence of a hydrosilylation catalyst such as Karstedt's catalyst (Platinum(0)-1,3-divinyl-1,1,3,3-tetramethyldisiloxane complex solution) or other catalyst known to those skilled in the art within a suitable solvent such as toluene or other solvent known to those skilled in the art to dissolve the hydrosilylation catalyst. The hydrosilylation catalyst used is typically a Pt catalyst. The preferred Pt catalyst is Karstedt's catalyst. However, one skilled in the art will appreciate that any of a number of other catalysts may be used. For example, [Cp*Ru(MeCN)$_3$]PF$_6$ (available from Sigma-Aldrich, St. Louis, Mo.) is a hydrosilylation catalyst that may be utilized in the second step of reaction scheme 1. Using [Cp*Ru(MeCN)$_3$]PF$_6$ catalyst, 2-5 mol % catalyst is typically used in acetone at room temperature.

Ethyl divinyl phosphinate (CAS Number 30594-15-1), which is also referred to as phosphonic acid, diethenyl-, ethyl ester, is a commercially available conventional phosphorous-based flame retardant. Trimethoxysilane is a commercially available, conventional hydrogen-terminated silane coupling agent.

The second step of reaction scheme 3 is performed at room temperature using conventional procedures well known in the art. In this second step, the phosphorous-containing silane monomer undergoes sol-gel polymerization to form a bridged polysilsesquioxane. The second step of reaction scheme 3 corresponds to the third step of reaction scheme 1, described above.

The bridged polysilsesquioxane synthesized in the second step of reaction scheme 3 subsequently undergoes conventional sol-gel processing to form bridged polysilsesquioxane particles. Suitable conventional sol-gel processing is described above with respect to reaction scheme 1. Typically, the solvent used in the sol-gel polymerization reaction is removed after the sol-gel polymerization reaction is complete. The gel is then dried, and crushed into particles. In terms of size, the bridged polysilsesquioxane particles may be course particles, fine particles, ultrafine particles, or nanoparticles.

Those skilled in the art will appreciate that the various steps of reaction scheme 3 are set forth for the purpose of illustration not limitation. For example, the first step of reaction scheme 3 utilizes as a reactant a particular vinyl-functionalized phosphorous-containing monomer, ethyl divinyl phosphinate. This utilization of this particular vinyl-functionalized phosphorous-containing monomer is exemplary. Any suitable vinyl-functionalized phosphorous-containing monomer may be utilized in lieu of ethyl divinyl phosphinate. In general, suitable vinyl-functionalized phosphorous-containing monomers in accordance with some embodiments of the second pathway include any phosphorous-containing organic monomer that is vinyl-functionalized in at least two sites.

Ethyl diallyl phosphinate and propyl diallyl phosphinate are examples of other suitable vinyl-functionalized phosphorous-containing monomers. Ethyl diallyl phosphinate (CAS Number 757-71-1), which is also referred to as phosphonic acid, diallyl-, ethyl ester, is a commercially available conventional phosphorous-based flame retardant. Propyl diallyl phosphinate (CAS Number 665-69-0), which is also referred to as phosphonic acid, diallyl-, propyl ester, is a commercially available conventional phosphorous-based flame retardant.

The first step of reaction scheme 3 synthesizes a particular phosphorous-containing silane monomer by reacting ethyl divinyl phosphinate with trimethoxysilane in the presence of a Pt catalyst. This particular synthesis of this particular phosphorous-containing silane monomer is exemplary. Any suitable phosphorous-containing silane monomer may be synthesized in lieu of this particular one. In general, suitable phosphorous-containing silane monomers in accordance with some embodiments of the second pathway include two or more trialkoxysilyl groups attached to an organic bridging group that contains a phosphorous-based flame retardant. Those skilled in the art will appreciate that such a monomer may be synthesized by reacting any suitably functionalized phosphorous-containing monomer (e.g., a phosphorous-based flame retardant functionalized to contain a suitable functional group) with any suitable silane coupling agent. In general, suitable functional groups may include vinyl, isocyanate, amine, and epoxy functional groups. In general, suitable silane coupling agents include conventional hydrogen-terminated silanes, such as trimethoxysilane and triethoxysilane, and conventional vinyl-terminated silanes, such as vinyltrimethoxysilane and vinyltriethoxysilane.

A hydrogen-terminated silane, such as trimethoxysilane, may be used in the first step of reaction scheme 3 to synthesize the phosphorous-containing silane monomer by hydrosilylation catalyzed coupling. As noted above, trimethoxysilane is a commercially available, conventional hydrogen-terminated silane coupling agent. The phosphorous-containing silane monomer is synthesized in the first step of reaction scheme 3 by hydrosilylation catalyzed coupling of the hydrogen-terminated silane onto the vinyl-functionalized phosphorous-containing monomer. Alternatively, a vinyl-terminated silane, such as vinyltrimethoxysilane, may be used in the first step of reaction scheme 3 to synthesize the phosphorous-containing silane monomer by olefin metathesis catalyzed coupling. In this alternative case, the phosphorous-containing silane monomer is synthesized by olefin metathesis catalyzed coupling of the vinyl-terminated silane onto the vinyl-functionalized phosphorous-containing monomer. This reaction is performed in the presence of an olefin metathesis catalyst such as Grubbs' catalyst (first generation (G1) and/or second generation (G2)), Schrock akylidenes, or other catalysts known to those skilled in the art within a suitable solvent such as dichloromethane (DCM) or other solvent known to those skilled in the art to dissolve the olefin catalyst. Generally, stoichiometric quantities of reactants may be used. This reaction is performed at room temperature using conventional procedures well known in the art.

Functionalized phosphorous-containing monomers suitable for reacting with silane coupling agents to produce phosphorous-containing silane monomers in accordance with some embodiments of the present invention may be either obtained commercially or synthesized. For example, suitable functionalized phosphorous-containing monomers that may be obtained commercially include dimethyl vinylphosphonate, dimethyl allylphosphonate, diethyl vinylphosphonate, and diethyl allylphosphonate. Generally, suitable functionalized phosphorous-containing monomers may be synthesized by functionalizing a conventional phosphorous-based flame retardant, such as a phosphonate (e.g., dimethyl methyl phosphonate; diethyl ethyl phosphonate; dimethyl propyl phosphonate; diethyl N,N-bis(2-hydroxyethyl) amino methyl phosphonate; phosphonic acid, methyl(5-methyl-2-methyl-1,3,2-dioxaphosphorinan-5-y) ester, P,P'-dioxide; and phosphonic acid, methyl(5-methyl-2-methyl-1, 3,2-dioxaphosphorinan-5-yl) methyl, methyl ester, P-oxide), a phosphate ester (e.g., triethyl phosphate; tributyl phosphate; trioctyl phosphate; and tributoxyethyl phosphate), or a phosphinate.

A conventional phosphorous-based flame retardant typically includes one or more of a phosphonate, a phosphate ester, or a phosphinate. Conventional phosphorous-based flame retardants that are phosphonates have the following generic molecular structure:

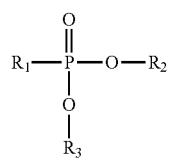

where $R_1$, $R_2$ and $R_3$ are organic substituents (e.g., alkyl, aryl, etc.) that may be the same or different.

Conventional phosphorous-based flame retardants that are phosphate esters have the following generic molecular structure:

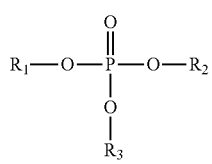

where $R_1$, $R_2$ and $R_3$ are organic substituents (e.g., alkyl, aryl, etc.) that may be the same or different.

Conventional phosphorous-based flame retardants that are phosphinates have the following generic molecular structure:

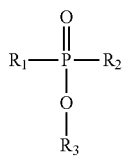

where $R_1$, $R_2$ and $R_3$ are organic substituents (e.g., alkyl, aryl, etc.) that may be the same or different.

One or more of the above conventional phosphorous-based flame retardants (i.e., phosphonate, phosphate ester, and/or phosphinate) and/or other conventional phosphate-based flame retardants may be functionalized using procedures well known to those skilled in the art to produce functionalized phosphorous-containing monomers suitable for reacting with silane coupling agents in accordance with some embodiments of the present invention.

For example, a conventional phosphorous-based flame retardant that is a phosphinate may be functionalized to produce a functionalized phosphorous-containing monomer, and then the functionalized phosphorous-containing monomer may be reacted with trimethoxysilane to produce a phosphorous-containing silane monomer having the following generic molecular structure:

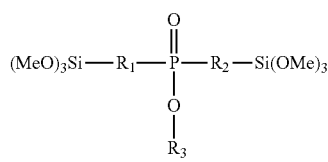

wherein $R_1$, $R_2$ and $R_3$ are organic substituents (e.g., alkyl, aryl, etc.) that may be the same or different.

In general, a phosphorous-containing silane monomer in accordance with some embodiments of the present invention includes two or more trialkoxysilyl groups attached to an organic bridging group, wherein the organic bridging group has a backbone portion that includes at least one phosphorous atom.

FIG. 1 is a block diagram illustrating an exemplary printed circuit board (PCB) 100 having layers of dielectric material that incorporate a bridged polysilsesquioxane-based flame retardant filler in accordance with some embodiments of the present invention. In the embodiment illustrated in FIG. 1, the PCB 100 includes one or more module sites 105 and one or more connector sites 110. FIG. 2 is a block diagram illustrating an exemplary laminate stack-up of the PCB 100 shown in FIG. 1. The configuration of the PCB 100 shown in FIG. 1 and its laminate stack-up shown in FIG. 2 are for purposes of illustration and not limitation.

Figure 2:
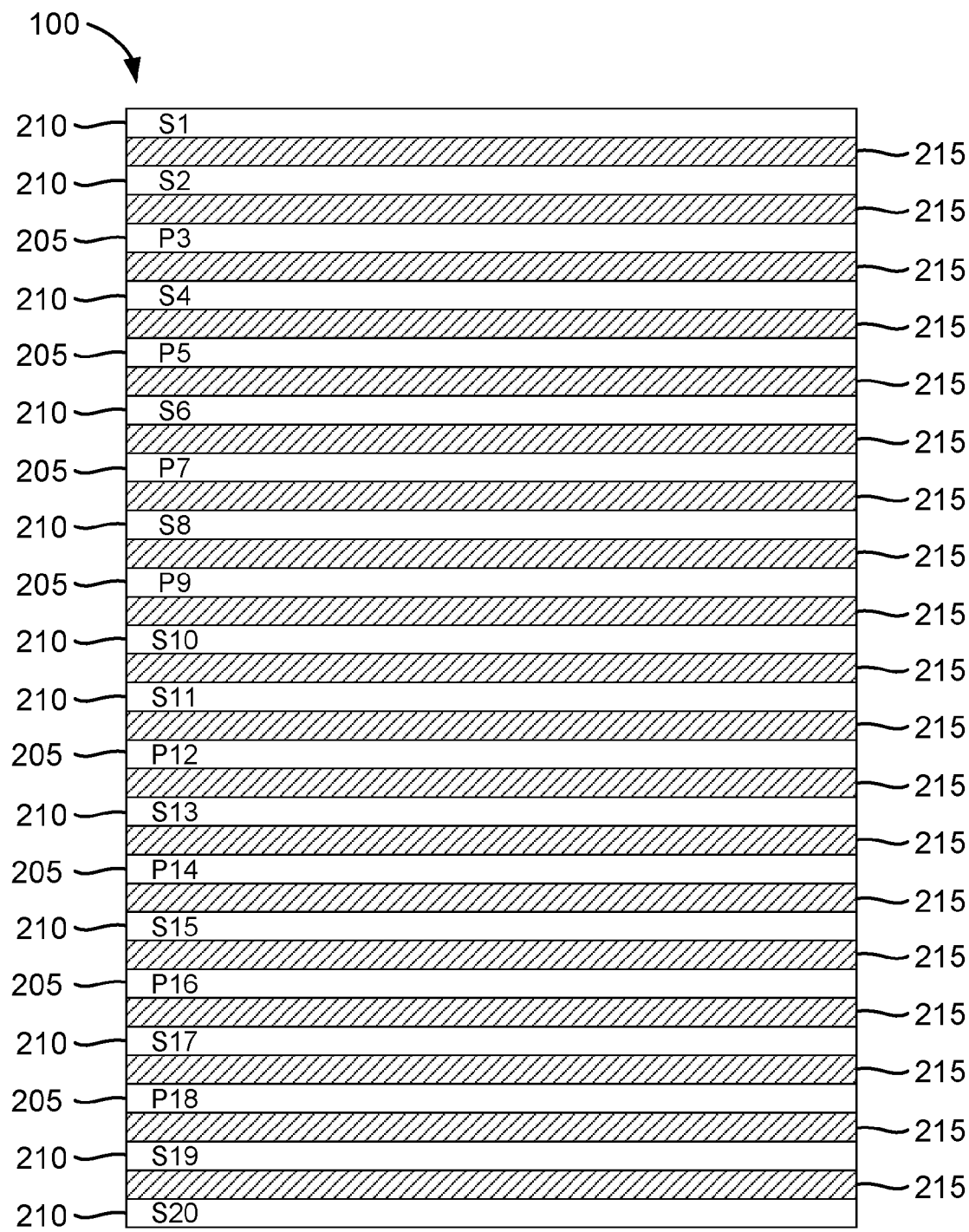
FIG. 2 is a block diagram illustrating an exemplary laminate stack-up of the PCB shown in FIG. 1.

As illustrated in FIG. 2, the laminate stack-up of the PCB 100 includes conductive planes (e.g., voltage planes 205 and signal planes 210) separated from each other by dielectric material 215. For example, the voltage planes 205 include power planes P3, P5, P7, etc., while the signal planes 210 include signal planes S1, S2, S4, etc. In accordance to some embodiments of the present invention, one or more of the layers of the dielectric material 215 includes a bridged polysilsesquioxane-based flame retardant filler having bridged polysilsesquioxane particles that imparts flame retardancy.

Each layer of dielectric material (e.g., the dielectric material 215) of a PCB typically includes a varnish coating (e.g., an FR4 epoxy resin, a bismaleimide triazine (BT) resin, or a polyphenylene oxide/trially-isocyanurate (PPO/TAIC) interpenetrating network) applied to a glass fiber substrate (e.g., woven glass fiber) having its surface modified by a silane coupling agent (e.g., typically consisting of an organofunctional group to bind to the varnish coating and a hydrolyzable group that binds to the surface of the glass fiber substrate, such as vinylbenzylaminoethylaminopropyl-trimethoxysilane or diallylpropylisocyanurate-trimethoxysilane). In accordance with some embodiments of the present invention, a bridged polysilsesquioxane-based flame retardant filler comprised of bridged polysilsesquioxane particles, for example, is incorporated into the varnish coating to impart flame retardancy.

FIG. 3 is a block diagram illustrating an exemplary connector 300 having a plastic housing 305 that incorporate a bridged polysilsesquioxane-based flame retardant filler in accordance with some embodiments of the present invention. In the embodiment illustrated in FIG. 3, the connector 300 is configured to make electrical contact with the connector site 110 (shown in FIG. 1) of the PCB 100. Also in the embodiment illustrated in FIG. 3, the connector 300 includes a cable 310. The configuration of the connector 300 shown in FIG. 3 is for purposes of illustration and not limitation.

In accordance with some embodiments of the present invention, a bridged polysilsesquioxane-based flame retardant filler comprised of bridged polysilsesquioxane particles, for example, is incorporated into the plastic housing 305 to impart flame retardancy. The base material of the plastic housing 305 may be, for example, liquid crystal polymer (LCP) or any suitable thermoplastic or thermoset to which the filler is added.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:
1. An article of manufacture, comprising:
  a housing comprising a plastic material, wherein the plastic material includes a flame retardant filler comprising a bridged polysilsesquioxane prepared by sol-gel polymerization of a monomer comprising two or more trialkoxysilyl groups attached to an organic bridging group, wherein the bridging group contains a fire retardant group selected from a halogen atom, a phosphinate, a phosphonate, a phosphate ester, and combinations thereof.

2. The article of manufacture as recited in claim 1, wherein the article of manufacture is a connector.

3. The article of manufacture as recited in claim 1, wherein the bridging group contains at least two bromine atoms as the fire retardant group and the monomer is represented by the following formula:

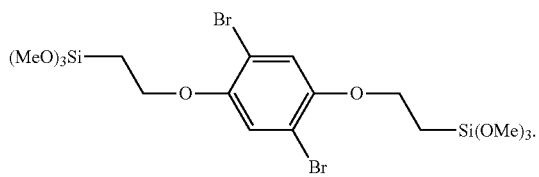

4. The article of manufacture as recited in claim 1, wherein the bridging group contains at least four bromine atoms as the fire retardant group and the monomer is represented by the following formula:

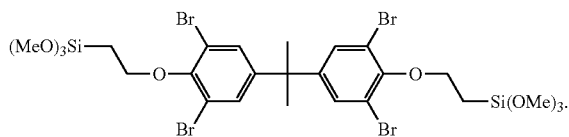

5. The article of manufacture as recited in claim 1, wherein the bridging group contains a phosphinate as the flame retardant group and the monomer is represented by the following formula:

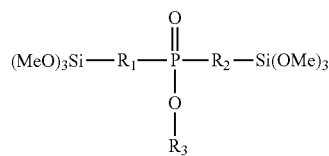

wherein $R_1$, $R_2$ and $R_3$ are organic substituents.

6. An article of manufacture, comprising:
a housing comprising a plastic material, wherein the plastic material includes a flame retardant filler comprising a bridged polysilsesquioxane prepared by sol-gel polymerization of a monomer comprising two or more trialkoxysilyl groups attached to an organic bridging group, wherein the organic bridging group has a backbone portion that includes at least two oxygen atoms, and wherein the organic bridging group is halogenated.

7. The article of manufacture as recited in claim 6, wherein the article of manufacture is a connector.

8. The article of manufacture as recited in claim 6, wherein the bridged polysilsesquioxane is incorporated into the plastic material in the form of bridged polysilsesquioxane particles.

9. The article of manufacture as recited in claim 8, wherein the bridged polysilsesquioxane particles serve both as a filler for rheology control and a flame retardant.

10. An article of manufacture, comprising:
a housing comprising a plastic material, wherein the plastic material includes a flame retardant filler comprising a bridged polysilsesquioxane prepared by sol-gel polymerization of a monomer comprising two or more trialkoxysilyl groups attached to an organic bridging group, wherein the organic bridging group contains a fire retardant group selected from a phosphinate, a phosphonate, a phosphate ester, and combinations thereof, and wherein the organic bridging group has a backbone portion that includes at least one phosphorous atom.

11. The article of manufacture as recited in claim 10, wherein the article of manufacture is a connector.

12. The article of manufacture as recited in claim 10, wherein the bridged polysilsesquioxane is incorporated into the plastic material in the form of bridged polysilsesquioxane particles.

13. The article of manufacture as recited in claim 12, wherein the bridged polysilsesquioxane particles serve both as a filler for rheology control and a flame retardant.

* * * * *